US009240807B2

(12) United States Patent
Oketani

(10) Patent No.: US 9,240,807 B2
(45) Date of Patent: Jan. 19, 2016

(54) RADIO TRANSMITTING/RECEIVING DEVICE, COMMUNICATION SYSTEM, AND CHANNEL CODING PROCESSING METHOD USED THEREBY

(75) Inventor: Kengo Oketani, Tokyo (JP)

(73) Assignee: NEC Corporation, Tokyo (JP)

( * ) Notice: Subject to any disclaimer, the term of this patent is extended or adjusted under 35 U.S.C. 154(b) by 95 days.

(21) Appl. No.: 14/127,141

(22) PCT Filed: May 11, 2012

(86) PCT No.: PCT/JP2012/003103
§ 371 (c)(1),
(2), (4) Date: Dec. 17, 2013

(87) PCT Pub. No.: WO2013/001706
PCT Pub. Date: Jan. 3, 2013

(65) Prior Publication Data
US 2014/0136922 A1 May 15, 2014

(30) Foreign Application Priority Data

Jun. 29, 2011 (JP) ................................. 2011-143663

(51) Int. Cl.
*H03M 13/00* (2006.01)
*H03M 13/17* (2006.01)
(Continued)

(52) U.S. Cl.
CPC .......... *H03M 13/17* (2013.01); *H03M 13/2707* (2013.01); *H03M 13/6525* (2013.01);
(Continued)

(58) Field of Classification Search
CPC ............ H03M 13/2707; H03M 13/17; H03M 13/6525; H03M 13/09; H03M 13/2957; H03M 13/635; H03M 13/1515; H03M 13/2966; H03M 13/2972; H03M 13/6538; H04L 1/0066; H04L 1/0071; H04L 1/005; H04L 1/0067; H04L 1/0057; H04L 1/0059; H04L 1/0065; H04L 1/004
See application file for complete search history.

(56) References Cited

U.S. PATENT DOCUMENTS

2005/0053168 A1* 3/2005 Song et al. .................... 375/261
2005/0094615 A1* 5/2005 Kim et al. ..................... 370/349
(Continued)

FOREIGN PATENT DOCUMENTS

| CN | 102187395 | 9/2011 |
|---|---|---|
| EP | 2343705 | 7/2011 |

(Continued)

OTHER PUBLICATIONS

Japanese Office Action issued by the Japanese Patent Office for Application No. 2013-522696 mailed on Sep. 16, 2014 (7 pages) (with translation).
(Continued)

*Primary Examiner* — Guerrier Merant
(74) *Attorney, Agent, or Firm* — Wilmer Cutler Pickering Hale and Dorr LLP

(57) ABSTRACT

A radio transmitting/receiving device uses a channel interleaver with turbo codes serving as error-correcting codes to convert burst errors into random errors. The radio transmitting/receiving device, in Code Block Concatenation (15), when dividing a Transport Block into a plurality of Code Blocks, performs channel coding so that burst errors that occur during transmission are distributed to all the Code Blocks. Therefore, when burst errors occur, the errors can be uniformly distributed to all Code Blocks in a Transport Block so that no unevenness occurs in error resilience between the Code Blocks.

3 Claims, 11 Drawing Sheets

(51) Int. Cl.
*H03M 13/27* (2006.01)
*H04L 1/00* (2006.01)
*H03M 13/29* (2006.01)

(52) U.S. Cl.
CPC ............ *H04L1/0066* (2013.01); *H04L 1/0071* (2013.01); *H03M 13/2957* (2013.01); *H03M 13/635* (2013.01); *H04L 1/005* (2013.01); *H04L 1/0067* (2013.01)

(56) References Cited

U.S. PATENT DOCUMENTS

| | | | |
|---|---|---|---|
| 2007/0038912 A1* | 2/2007 | Hashimoto et al. ............ | 714/755 |
| 2008/0311920 A1* | 12/2008 | Xu et al. ........................ | 455/450 |
| 2008/0313526 A1* | 12/2008 | Choi et al. ..................... | 714/780 |
| 2010/0235706 A1* | 9/2010 | Eberlein et al. ................ | 714/752 |
| 2011/0107176 A1* | 5/2011 | Song et al. ..................... | 714/755 |

FOREIGN PATENT DOCUMENTS

| | | |
|---|---|---|
| JP | 06-077939 | 3/1994 |
| JP | 2010-103882 | 5/2010 |
| JP | 2010/541460 A | 12/2010 |
| WO | WO-2008/084532 | 7/2008 |
| WO | WO-2010/050446 | 5/2010 |

OTHER PUBLICATIONS

No Author Listed, "3GPP TS 36.212 V8.8.0, 3rd Generation Partnership Project; Technical Specification Group Radio Access Network; Evolved Universal Terrestrial Radio Access (E-UTRA); Multiplexing and channel coding, (Release 8)," 15 pages (Dec. 2009).

No Author Listed, "Uplink channel interleaving," Motorola, 3GPP TSG RAN1 #50, Athens, Greece, 11 pages (Aug. 20-24, 2007).

International Search Report corresponding to PCT/JP2012/003103, dated Jun. 8, 2012, 3 pages.

3GPP, "3rd Generation Partnership Project; Technical Specification Group Radio Access Network; Evolved Universal Terrestrial Radio Access (E-UTRA); Multiplexing and channel coding (Release 8)", 3GPP TS 36.212 V8.8.0, Dec. 2009, pp. 20-21.

3GPP "3rd Generation Partnership Project; Technical Specification Group Radio Access Network; Evolved Universal Terrestrial Radio Access (E-UTRA); Multiplexing and channel coding (Release 8)", 3GPP TS 36.212, .V8.8.0, Dec. 9, 2009, pp. 1-60.

Extended European Search Report corresponding to European Application No. 12804799.0, dated Jul. 22, 2015, 9 pages.

Samsung "Row-column based channel interleaver for E-UTRA", 3GPP TSG RAN WG1 Meeting #49bis, Orlando, FL, USA, Jun. 25-29, 2007, pp. 1-5.

* cited by examiner

STEP1: $\underline{f}_{i+jL'} = \underline{e}_{j,i} (i=0,1,\cdots,L'-1; j=0,1,\cdots,C'-1)$ STEP2: $\underline{f}_{i+jL''+L'C'} = \underline{e}_{j,i} (i=0,1,\cdots,L''-1; j=0,1,\cdots,C''-1)$ STEP3: $\underline{f}_{i+L'C'+L''C''} = \underline{e}_{j,\left\lfloor \frac{i}{C_{mux} \times C} \right\rfloor \times C_{mux} + (i \bmod C_{mux}) + L'''}$ $(i=0,1,\cdots,G'-(C'L'+C''L'')-1,$ $$j = \lfloor i/C_{mux} \rfloor \bmod C)$$

WHERE $L' = \lfloor G'/C \rfloor - \lfloor \lfloor G'/C \rfloor / C_{mux} \rfloor \times C_{mux}$, $L'' = \lceil G'/C \rceil - \lfloor \lceil G'/C \rceil / C_{mux} \rfloor \times C_{mux}$, $C' = C - (G' \bmod C)$, $C'' = G' \bmod C$, $L''' = L'$ (when $j < C'$), $L''' = L''$ (when $j \geq C'$).

Fig. 2

[Step1]

$\underline{f}_0 = \underline{e}_{0,0}, \underline{f}_1 = \underline{e}_{0,1}, \underline{f}_2 = \underline{e}_{0,2}, \underline{f}_3 = \underline{e}_{0,3},$ (←Code Block0)

[Step2]

$\underline{f}_4 = \underline{e}_{1,0}, \underline{f}_5 = \underline{e}_{1,1}, \underline{f}_6 = \underline{e}_{1,2}, \underline{f}_7 = \underline{e}_{1,3}, \underline{f}_8 = \underline{e}_{1,4},$ (←Code Block1)

$\underline{f}_9 = \underline{e}_{2,0}, \underline{f}_{10} = \underline{e}_{2,1}, \underline{f}_{11} = \underline{e}_{2,2}, \underline{f}_{12} = \underline{e}_{2,3}, \underline{f}_{13} = \underline{e}_{2,4},$ (←Code Block2)

$\underline{f}_{14} = \underline{e}_{3,0}, \underline{f}_{15} = \underline{e}_{3,1}, \underline{f}_{16} = \underline{e}_{3,2}, \underline{f}_{17} = \underline{e}_{3,3}, \underline{f}_{18} = \underline{e}_{3,4},$ (←Code Block3)

$\underline{f}_{19} = \underline{e}_{4,0}, \underline{f}_{20} = \underline{e}_{4,1}, \underline{f}_{21} = \underline{e}_{4,2}, \underline{f}_{22} = \underline{e}_{4,3}, \underline{f}_{23} = \underline{e}_{4,4},$ (←Code Block4)

Fig. 3A

[Step3]

$f_{24} = e_{0,4}, f_{25} = e_{0,5}, f_{26} = e_{0,6}, f_{27} = e_{0,7}, f_{28} = e_{0,8}, f_{29} = e_{0,9}, f_{30} = e_{0,10},$
$f_{31} = e_{0,11}, f_{32} = e_{0,12}, f_{33} = e_{0,13}, f_{34} = e_{0,14}, f_{35} = e_{0,15},$ (←Code Block0)

$f_{36} = e_{1,5}, f_{37} = e_{1,6}, f_{38} = e_{1,7}, f_{39} = e_{1,8}, f_{40} = e_{1,9}, f_{41} = e_{1,10}, f_{42} = e_{1,11},$
$f_{43} = e_{1,12}, f_{44} = e_{1,13}, f_{45} = e_{1,14}, f_{46} = e_{1,15}, f_{47} = e_{1,16},$ (←Code Block1)

$f_{48} = e_{2,5}, f_{49} = e_{2,6}, f_{50} = e_{2,7}, f_{51} = e_{2,8}, f_{52} = e_{2,9}, f_{53} = e_{2,10}, f_{54} = e_{2,11},$
$f_{55} = e_{2,12}, f_{56} = e_{2,13}, f_{57} = e_{2,14}, f_{58} = e_{2,15}, f_{59} = e_{2,16},$ (←Code Block2)

$f_{60} = e_{3,5}, f_{61} = e_{3,6}, f_{62} = e_{3,7}, f_{63} = e_{3,8}, f_{64} = e_{3,9}, f_{65} = e_{3,10}, f_{66} = e_{3,11},$
$f_{67} = e_{3,12}, f_{68} = e_{3,13}, f_{69} = e_{3,14}, f_{70} = e_{3,15}, f_{71} = e_{3,16},$ (←Code Block3)

$f_{72} = e_{4,5}, f_{73} = e_{4,6}, f_{74} = e_{4,7}, f_{75} = e_{4,8}, f_{76} = e_{4,9}, f_{77} = e_{4,10}, f_{78} = e_{4,11},$
$f_{79} = e_{4,12}, f_{80} = e_{4,13}, f_{81} = e_{4,14}, f_{82} = e_{4,15}, f_{83} = e_{4,16},$ (←Code Block4)

$f_{84} = e_{0,16}, f_{85} = e_{0,17}, f_{86} = e_{0,18}, f_{87} = e_{0,19}, f_{88} = e_{0,20}, f_{89} = e_{0,21}, f_{90} = e_{0,22},$
$f_{91} = e_{0,23}, f_{92} = e_{0,24}, f_{93} = e_{0,25}, f_{94} = e_{0,26}, f_{95} = e_{0,27},$ (←Code Block0)

...

Fig. 3B $$\begin{bmatrix} \underline{g}_0 & \underline{g}_1 & \underline{g}_2 & \cdots & \underline{g}_{C_{mux}-1} \\ \underline{g}_{C_{mux}} & \underline{g}_{C_{mux}+1} & \underline{g}_{C_{mux}+2} & \cdots & \underline{g}_{2C_{mux}-1} \\ \cdots & \cdots & \cdots & \ddots & \cdots \\ \underline{g}_{(R'_{mux}-1)\times C_{mux}} & \underline{g}_{(R'_{mux}-1)\times C_{mux}+1} & \underline{g}_{(R'_{mux}-1)\times C_{mux}+2} & \cdots & \underline{g}_{(R'_{mux}\times C_{mux}-1)} \end{bmatrix}$$

CHANNEL INTERLEAVE MATRIX

Fig. 7A

RADIO TRANSMITTING/RECEIVING DEVICE, COMMUNICATION SYSTEM, AND CHANNEL CODING PROCESSING METHOD USED THEREBY

CROSS-REFERENCE TO RELATED APPLICATIONS

This application is a national stage application of International Application No. PCT/JP2012/003103 entitled "Wireless Transceiver Device, Communication System and Channel-Coding Processsing Method Used in the Same Device and System," filed on May 11, 2012, which claims the benefit of the priority of Japanese Patent Application No. 2011-143663, filed on Jun. 29, 2011, the disclosures of each of which are hereby incorporated by reference in their entirety.

TECHNICAL FIELD

The present invention relates to a radio transmitting/receiving device, communication system, and channel coding processing method used thereby. In particular, the present invention relates to a channel coding method in the 3GPP (3rd Generation Partnership Project) Release 8 (LTE: Long Term Evolution).

BACKGROUND ART

In data communication, the error-correcting code/decode is used generally in the transmitting/receiving side in order to correct errors that occur during transmission. This error-correcting technology is generally useful in correcting "random errors," which occur at discrete locations in transmission data, and is being widely used in general communication for this purpose. However, for "burst errors," which are errors that successively occur at concentrated particular locations in transmission data, this technology is believed to suffer a reduction in error-correcting capability and the resulting degradation of transmission characteristics.

For this reason, an interleaver (interleave function) is being widely used as a technology for correcting burst errors efficiently in combination with error correction. Simply put, the interleave function refers to a function with which the transmitting side sorts transmission data according to a certain rule and transmits the sorting data.

If such interleaved data is transmitted and burst errors occur while transmitting, the receiving side restores the sequence of the received data to the sequence prior to the interleave performed by the transmitting side (this process performed by the receiving side is called "deinterleave"). Thus, the burst error locations which occur while transmitting are distributed and the burst errors converted into random errors, thereby error-correcting is performed efficiently.

Hereafter, the channel coding method in the 3GPP Release 8 (LTE) and problems of the method will be described.

Based on the above idea, in the specification of the uplink communication method in the mobile communication standard, 3GPP LTE, also a channel interleaver is used with turbo codes which are the error-correcting codes in order to convert burst errors into random errors. FIG. 5 shows a channel coding processing unit of a radio transmitting/receiving device at the transmitting side, which is configured based on this specification. To simplify the description, an example in which the number of Code Blocks is two is used. Hereafter, the operation of this channel coding processing unit will be described.

In Transport Block CRC (Cyclic Redundancy Check) Attachment (11), a CRC is attached to transmission data (Transport Block) passed by an upper layer.

In Code Block Segmentation (12), for the Transport Block after attaching the CRC, the Transport Block is segmented into blocks so that the number of bits inputted to a subsequent turbo encoder falls within 6144 bits. Each of the blocks after segmenting process will be referred to as Code Blocks.

Note that if the size of the Transport Block after attaching the CRC falls within 6144 bits, the segmenting process does not need and the Transport Block becomes a Code Block as it is.

In Code Block CRC Attachment (13), a CRC is attached to each Code Block.

In Turbo Coding & Rate Matching (14), the Code Blocks after attaching the CRC are coded to the turbo code, furthermore performed the rate matching for adjusting the code rate.

In Code Block Concatenation (25), the Code Blocks after turbo coding and rate matching are concatenated (linked) into one.

In Data & Control Multiplexing (16), a control information portion of the transmission data and the data portion, where the Code Blocks generated in the above series of steps are concatenated, are multiplexed.

In Channel Interleaver (17), the data sequence after multiplexing the control information portion and the data portion is performed interleave process to change the sequence thereof.

The bit sequence generated in the above steps is mapped to modulation symbols of QPSK (Quadrature Phase Shift Keying), 16QAM (Quadrature Amplitude Modulation), 64QAM, or the like, further mapped to the Data Symbol portion of the PUSCH (Physical Uplink Shared Channel), and transmitted.

Note that FIG. 6 shows the sub-frame format in case of Normal CP (Cyclic Prefix) of the PUSCH defined in the 3GPP LTE. One sub-frame has a length of 1 ms and is configured from 14 SC-FDMA symbols. The symbols include two types of symbols: "data symbols" configured from 12 symbols and "reference symbols" configured from 2 symbols. A "data symbol" is a field to which transmission data is mapped. In a "reference symbol," a known sequence by both the transmitting and receiving seides is transmitted. And a "reference symbol" is used, for estimating the propagation path by the receiving side, or the like.

In the receiving side, channel coding process is performed in an order reverse to the above steps. First, channel deinterleave (a process reverse to the channel interleave) is performed, then the data portion and the control information portion are demultiplexed, and then Code Block Segmentation (a process reverse to the Code Block Concatenation performed by the transmitting side) is performed to segment into each of Code Blocks.

For each of the Code Blocks segmented, is performed rate de-matching process (a process reverse to the rate matching performed by the transmitting side) and then turbo decoding process is performed, and then CRC check is performed for each of Code Blocks.

It is generally believed that: burst errors which occur during transmission are converted into random errors by the channel deinterleave process, which is performed by the first step in the receiving side; and the random errors are then inputted to a turbo decoder, thereby error-correcting is performed efficiently.

This (efficient execution of the subsequent error correcting process owing to the deinterleave process) can hold true for cases where the Transport Block is composed of one Code Block.

However, if the number of Code Blocks is two or more (Code Block segmentation is performed), there occurs a problem that burst errors are converted into random errors only in a particular Code Block after the channel deinterleave and thus only the particular Code Block suffers significant degradation of transmission characteristics. This problem will be described below. Accordingly, simply complying with the channel interleave specification of the current 3GPP LTE may not be sufficient to cope with burst errors.

The above problem will be described in detail. To describe the problem simply, there will be used an example in which the number of Code Blocks is two (Code Blocks 0 and 1) and in which control information is not multiplexed (only the data portion is transmitted).

The bit sequence of Code Block 0 after turbo coding and rate matching is $$e_{0,0}, e_{0,0}, \ldots, e_{o,E_0-1} \quad \text{[Formula 1]}$$

and the bit sequence of Code Block 1 is as follows.

$$e_{1,0}, e_{1,0}, \ldots, e_{1,E_1-1} \quad \text{[Formula 2]}$$

In addition, assume that the sizes of Code Blocks 0, 1 are E0, E1 [bit].

At this time, the bit sequence after concatenating the Code Blocks is as follows.

$$\{f_0, f_1, f_2, \ldots, f_{G-1}\} = \{e_{0,0}, e_{0,0}, \ldots, e_{0,E_0-1}, e_{1,0}, e_{1,0}, \ldots, e_{1,E_1-1}\} \quad \text{[Formula 3]}$$

Here, assume that G is the bit number after the Code Blocks are concatenated, G is as follows.

$$G = E0 + E1$$

Then, the bit sequence after the Code Blocks are concatenated is combined for each bit of the modulation multi-level number. For example, in QPSK (modulation multi-level number=2), $$g_0 = \{f_0, f_1\}, g_1 = \{f_2, f_3\}, \ldots, g_{H'-1} = \{f_{G-2}, f_{G-1}\} \quad \text{[Formula 4]}$$

as above, a sequence combined for each two bits, $$\{g_0, g_1, \ldots, g_{H'-1}\} \quad \text{[Formula 5]}$$

is formed.

Also, in 16QAM (modulation multi-level number=4), $$\underline{g}_0 = \{f_0, f_1, f_2, f_3\}, \underline{g}_1 \quad \text{[Formula 6]}$$
$$= \{f_4, f_5, f_6, f_7\}, \ldots, \underline{g}_{H'-1}$$
$$= \{f_{G-4}, f_{G-3}, f_{G-2}, f_{G-1}\}$$

as above, a sequence combined for each four bits, $$\{g_0, g_1, \ldots, g_{H'-1}\} \quad \text{[Formula 7]}$$

is formed.

Here, if the modulation multi-level number is Qm (for QPSK, Qm=2; for 16QAM, Qm=4; for 64QAM, Qm=6) and the length of a sequence, as follows, combined for each bit of Qm is H', $$\{g_0, g_1, \ldots, g_{H'-1}\} \quad \text{[Formula 8]}$$

H' is H'=G/Qm. This sequence is inputted to the channel interleave unit to perform channel interleave.

FIGS. 7A and 7B show conceptual diagrams of a channel interleave matrix and a channel interleave process. In the channel interleave unit, an input bit sequence is as follows.

$$\{g_0, g_1, \ldots, g_{H'-1}\} \quad \text{[Formula 9]}$$

This bit sequence is written to a following matrix, as shown in FIG. 7A, $$R'_{mux} \times C_{mux} \quad \text{[Formula 10]}$$

in a row direction sequentially, starting with the first row. Here, as follows.

$$H' = R'_{mux} \times C_{mux}, C_{mux} = N_{symb}^{PUSCH} \quad \text{[Formula 11]}$$

($N_{symb}^{PUSCH}$ represents the number of SC-FDMA symbols per 1 TTI transmitted in PUSCH; in FIG. 6, $N_{symb}^{PUSCH}=12$ $$R'_{mux} = H'/C_{mux} \quad \text{[Formula 12]}$$

As shown in the output (read) of FIG. 7B, an output from the channel interleave unit is obtained by, reading the interleave matrix from top to bottom sequentially in the order of the first column, then, reading from top to bottom sequentially in the order of the second column, and repeating this process in the order for each columns. The output sequence is in order as follows.

$$\{g_0, g_{C_{mux}}, g_{2C_{mux}}, \ldots, g_{\{R'_{mux}-1\} \times C_{mux}}, g_1, g_{C_{mux}+1},$$
$$g_{2C_{mux}+1}, \ldots, g_{\{R'_{mux}-1\} \times C_{mux}+1}, g_2, g_{C_{mux}+2},$$
$$g_{2C_{mux}+2}, \ldots, g_{\{R'_{mux}-1\} \times C_{mux}+2}, \ldots, g_{C_{mux}-1},$$
$$g_{2C_{mux}-1}, g_{3C_{mux}-1}, \ldots, g_{R'_{mux} \times C_{mux}-1}\} \quad \text{[Formula 13]}$$

The channel-interleaved output data is then mapped to modulation symbols in units of a bit number of the modulation multi-level number, and further mapped to the data symbols of FIG. 6, and transmitted.

Note that the channel coding process related to the present invention is a technique disclosed in Patent Literature 1 below. The technique disclosed in Patent Literature 1 has the problem that since TF (Transport Format), that is, transport block size and Transport Block number is variable on a TTI (Transmission Time Interval) basis, the coding/decoding algorithm must be variable for each TTI (increasing the amount of computation).

To solve the problem, the technique disclosed in Patent Literature 1 divides a parameter (TFI) into a parameter which changes during communication and a parameter which does not change during communication. This technique also divides a coding/decoding process into a process corresponding to the parameter which changes and a process corresponding to the parameter which does not change. Thus, the technique prevents an increase in the amount of computation.

CITATION LIST

Patent Literature

[Patent Literature 1] International Publication WO2008/084532

SUMMARY OF INVENTION

Technical Problem

By the result of Code Block concatenating and channel-interleaving as described above, the distribution of Code Blocks 1 and 2 in the transmission signal is as shown in FIG. 8. That is, in the SC-FDMA symbols, Code Block 1 is disposed in the first half, Code Block 2 is disposed in the latter half, and transmitted.

Now assume that burst errors as shown in FIG. 9 occur during transmission, that is, assume that burst error locations occur only in a particular location (in this example, only in the first half of symbol #1). In this case, by passing through a channel deinterleave process in the receiving side, the error locations' self are distributed and converted into random errors. However, the error locations are distributed to only one of the Code Blocks. In this example, the errors are distributed only in Code Block 1 into random; no errors are distributed to Code Block 2.

Similarly, when burst errors occur only in the latter half of a particular symbol, the errors are subjected to deinterleave in the receiving side and thus distributed only in Code Block 2 into random; no errors are distributed to Code Block 1.

As a result, one of the Code Blocks to which the errors have been distributed into random suffer significant degradation of transmission characteristics compared to the other of the Code Blocks in which no errors have occurred.

Here, the 3GPP LTE specification provides that "when even one of all Code Blocks in a Transport Block is no good in a CRC check, all the Code Blocks in the Transport Block be retransmitted." Accordingly, it may be preferred that "when burst errors occur, the errors be uniformly distributed to all the Code Blocks in the Transport Block, thereby no occurring unevenness in error resilience between the Code Blocks (no difference in error resilience between the Code Blocks)."

However, as described above, according to the current 3GPP LTE specification, components of one Code Block are disposed somewhat continuously in time even after the interleave and thus the burst errors are not distributed to all the Code Blocks (the errors intensively occur in particular Code Blocks) even after the deinterleave in the receiving side. As a result, there occurs a problem that the particular Code Blocks suffer significant degradation of transmission characteristics and therefore the entire Transport Block (including Code Blocks in which no errors have occurred) must be retransmitted.

Accordingly, an object of the present invention is to provide a radio transmitting/receiving device, communication system, and channel coding processing method used thereby that solve the above problem, that is, when burst errors occur, can uniformly distribute the errors to all Code Blocks in a Transport Block so that no unevenness in error resilience occurs between the Code Blocks.

Solution to Problem

A radio transmitting/receiving device of the present invention uses a channel interleaver with turbo codes serving as error-correcting codes to convert burst errors into random errors, the radio transmitting/receiving device, when dividing a Transport Block into a plurality of Code Blocks, performs channel coding so that burst errors that occur during transmission are distributed to all the Code Blocks.

A communication system of the present invention comprises the radio transmitting/receiving device of above.

A channel coding processing method of the present invention is used in a radio transmitting/receiving device that uses a channel interleaver with turbo codes serving as error-correcting codes to convert burst errors into random errors, performing, when dividing a Transport Block into a plurality of Code Blocks, channel coding so that burst errors that occur during transmission are distributed to all the Code Blocks.

Advantageous Effects of Invention

According to the above configuration and operation of the present invention, there can be obtained an advantage that when burst errors occur, the errors can be uniformly distributed to all Code Blocks in a Transport Block so that no unevenness occurs in error resilience between the Code Blocks.

BRIEF DESCRIPTION OF DRAWINGS

FIG. 2 is a diagram showing a Code Block concatenation algorithm according to the embodiment of the present invention;

FIG. 3A is diagram showing an example application to the Code Block concatenation algorithm according to the embodiment of the present invention;

FIG. 3B is diagram showing an example application to the Code Block concatenation algorithm according to the embodiment of the present invention;

FIG. 7A is a diagram showing a channel interleave matrix at the transmitting side in LTE uplink related the present invention;

DESCRIPTION OF EMBODIMENTS

Figure 1:
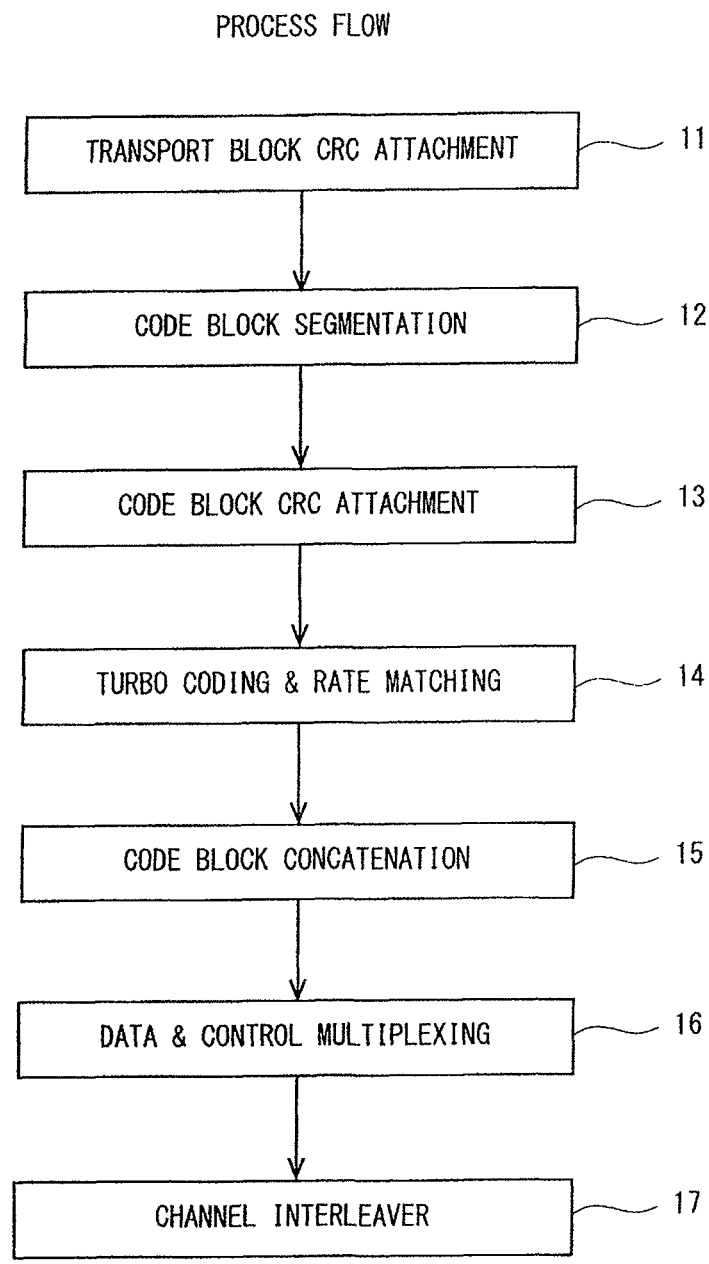
FIG. 1 is a diagram showing a channel coding process performed by a radio transmitting/receiving device at the transmitting side according to the embodiment of the present invention.

Now, an embodiment of the present invention will be described with reference to the drawings. FIG. 1 is a diagram showing a channel coding process performed by a radio transmitting/receiving device at the transmitting side according to the embodiment of the present invention.

The uplink communication specification of the mobile communication standard, the 3GPP (3rd Generation Partnership Project) Release 8 (LTE: Long Term Evolution) provides that a channel interleaver be used along with turbo codes serving as error-correcting codes in order to convert burst errors into random errors.

FIG. 1 shows a channel coding process performed by a radio transmitting/receiving device at the transmitting side, which is configured based on this specification. To simplify the description, an example in which the number of Code Blocks is 2 is used.

The channel coding process performed by the radio transmitting/receiving device at the transmitting side according to the present embodiment includes Transport Block CRC (Cyclic Redundancy Check) Attachment (11), Code Block Segmentation (12), Code Block CRC Attachment (13), Turbo Coding & Rate Matching (14), Code Block Concatenation (15), Data & Control Multiplexing (16), and Channel Interleaver (17).

Note that the steps of this channel coding process except for Code Block Concatenation (15) are as described in Background Art above and therefore will not be described. Hereafter, the process of Code Block Concatenation (15) will be described.

To achieve the above object, the present embodiment provides a method which is a channel coding method so that burst errors occurred during transmission are distributed to all Code Blocks when dividing a Transport Block into multiple Code Blocks. A conceivable example of such a channel coding method is a Code Block concatenation method described below. The mainly difference between the present embodiment and the method described in Background Art above is the "Code Block concatenation method" described below.

Figure 4:
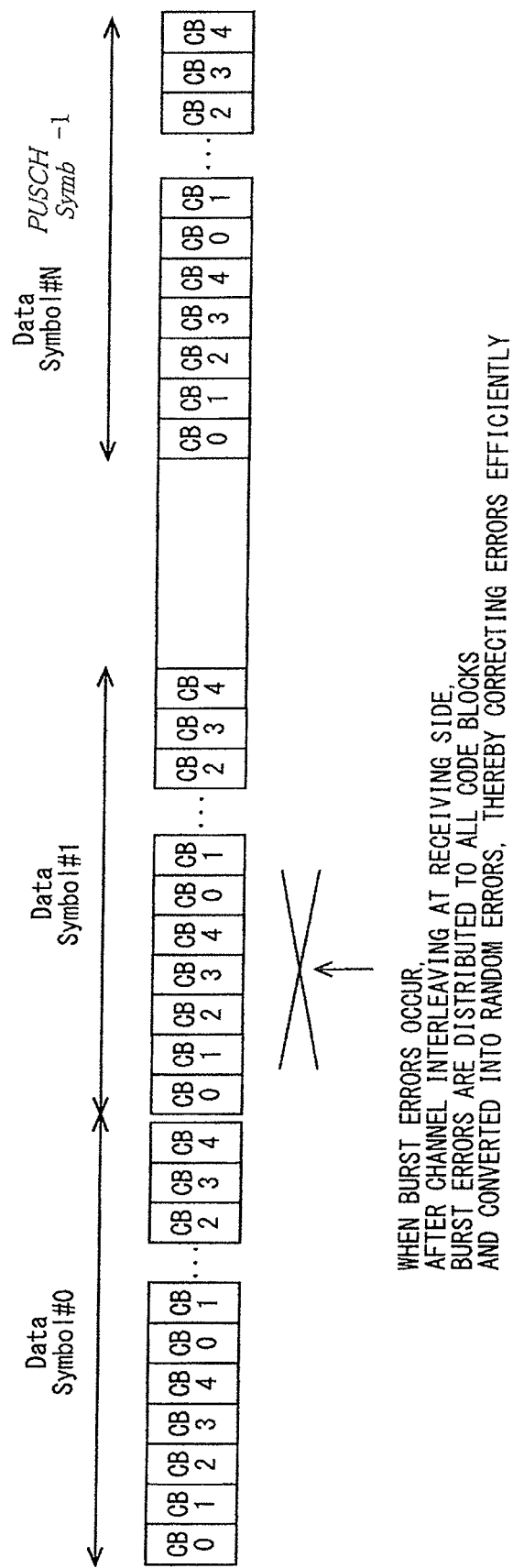
FIG. 4 is a diagram showing the distribution of Code Blocks after up channel interleaving when the present invention is applied.
Figure 5:
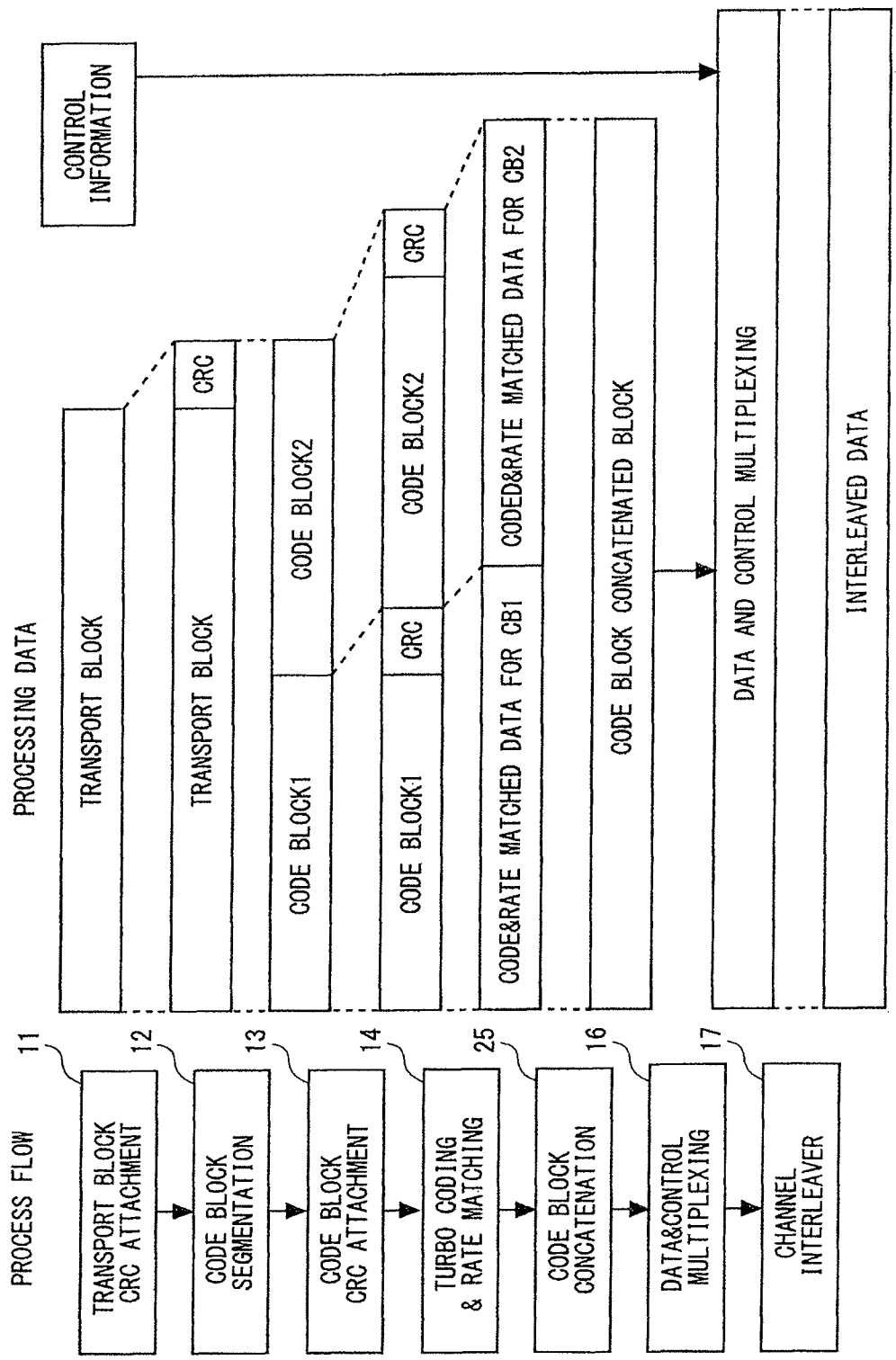
FIG. 5 is a diagram showing a channel coding process performed by a radio transmitting/receiving device at the transmitting side of related the present invention.
Figure 6:
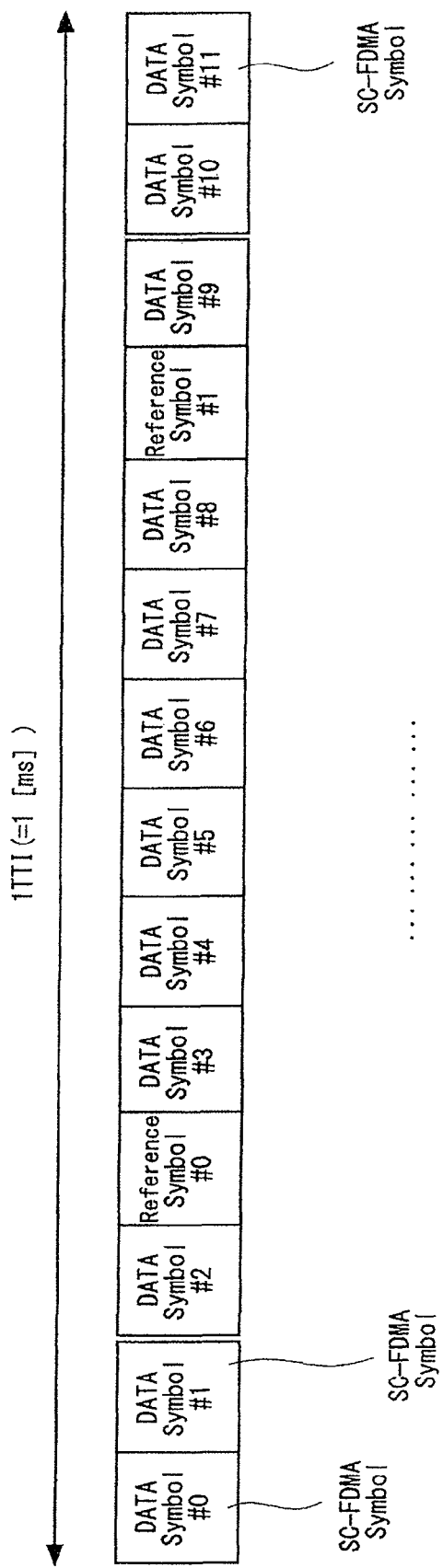
FIG. 6 is a diagram showing a construction of the frame format in LTE uplink related the present invention.
Figure 7B:
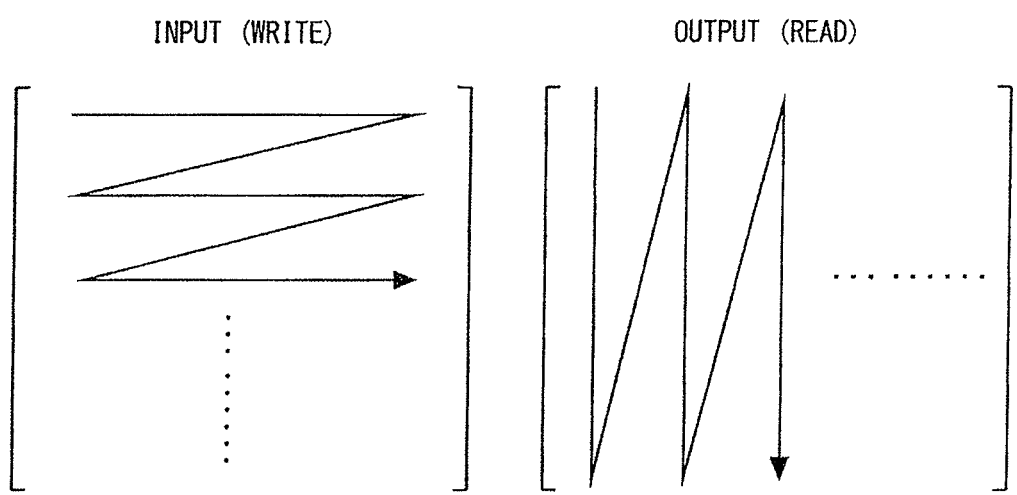
FIG. 7B is a diagram showing a conceptual of channel interleave at the transmitting side in LTE uplink related the present invention.
Figure 8:
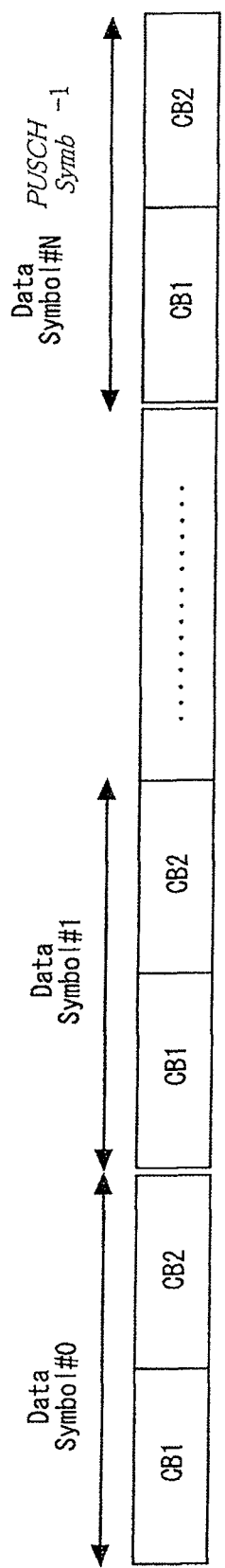
FIG. 8 is a diagram showing the distribution of Code Blocks after channel interleaving when channel coding method defined the 3GPP LTE is applied.
Figure 9:
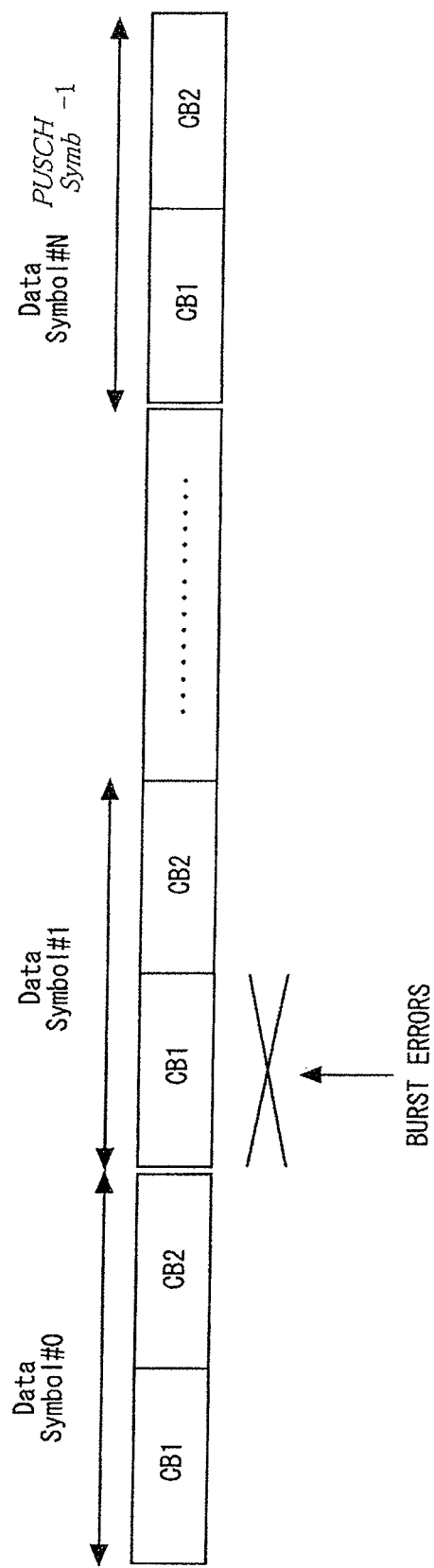
FIG. 9 is a diagram showing an example of the burst error related the present invention.

FIG. 2 is a diagram showing a Code Block concatenation algorithm according to the embodiment of the present invention. FIGS. 3A and 3B are diagrams showing example applications to the Code Block concatenation algorithm according to the embodiment of the present invention. FIG. 4 is a diagram showing the distribution of Code Blocks after channel interleaving when the present invention is applied. Referring to FIGS. 2 to 4, the process according to the present embodiment will be described specifically. In this example, the following parameters are used:

[Formula 14]

Modulation multi-level number $Q_m$: 4 (that is, the modulation method is 16QAM)

The number of RE (Resource Elements) allocated to PUSCH, G': 11664

The number of bits allocated to PUSCH, G: 46656 (=G'× $Q_m$=11664×4)

The number of Code Blocks, C: 5

The number of bits ($E_0$) and the number of modulation symbols ($E'_0$) of Code Block 0 after turbo coding and rate matching: $E_0$=9328; $E'_0$=2332 (=$E_0/Q_m$)

The number of bits ($E_1$, $E_2$, $E_3$, $E_4$) and the number of modulation symbols ($E'_1$, $E'_2$, $E'_3$, $E'_4$) of Code Blocks 1, 2, 3, and 4 after turbo coding and rate matching: $E_1$, $E_2$, $E_3$, $E_4$=9332; $E'_1$, $E'_2$, $E'_3$, $E'_4$=2332

The number of columns of channel interleave, $C_{mux}$: 12

The number of rows of channel interleave, $R_{mux}$: 972 (=G'/$C_{mux}$=11664/12)

A bit sequence after turbo coding and rate matching to Code Block$^{r(=0, 1, \ldots, C-1)}$ is defined as follows.

$$e_{r,0}, e_{r,1}, \ldots, e_{r,E_r-1}$$ [Formula 15]

In the present embodiment, first, there is performed a process of combining this sequence for each bit of the modulation multi-level number. As a result, a sequence as follows is generated.

$$\underline{e}_{r,0}, \underline{e}_{r,1}, \ldots, \underline{e}_{r,E'_r-1}$$ [Formula 16]

In this example, the modulation multi-level number Qm is 4 and therefore each of the elements of the above sequence are expressed as follows by using the sequence which has yet to be combined for each bit of the modulation multi-level number.

$$\underline{e}_{r,i} = \{e_{r,4i}, e_{r,4i+1}, e_{r,4i+2}, e_{r,4i+3}\}$$ [Formula 17]

Also, the data of each Code Block after processing above in this example is represented as follows.

Code Block 0: $\underline{e}_{0,0}, \underline{e}_{0,1}, \ldots, \underline{e}_{0,2331}$ (sequence length $E'_0$=2332)

Code Block 1: $\underline{e}_{1,0}, \underline{e}_{1,1}, \ldots, \underline{e}_{1,2332}$ (sequence length $E'_1$=2333)

Code Block 2: $\underline{e}_{2,0}, \underline{e}_{2,1}, \ldots, \underline{e}_{2,2332}$ (sequence length $E'_2$=2333)

Code Block 3: $\underline{e}_{3,0}, \underline{e}_{3,1}, \ldots, \underline{e}_{3,2332}$ (sequence length $E'_3$=2333)

Code Block 4: $\underline{e}_{4,0}, \underline{e}_{4,1}, \ldots, \underline{e}_{4,2332}$ (sequence length $E'_4$=2333) [Formula 18]

Next, the Code Block concatenation algorithm according to the present embodiment will be described. FIG. 2 shows the Code Block concatenation algorithm according to the present embodiment. Here, $$\underline{f}_i (i=0,1,\ldots,G-1)$$ [Formula 19]

represents a sequence after concatenating the Code Blocks, and G represents the length of the sequence.

For the above example, parameters required by the Code Block concatenation algorithm according to the present invention are calculated as follows.

$L' = \lfloor G'/C \rfloor - \lfloor \lfloor G'/C \rfloor / C_{mux} \rfloor \times_{mux} = 4$ $L'' = \lceil G'/C \rceil - \lfloor \lceil G'/C \rceil / C_{mux} \rfloor \times_{mux} = 5$ $C' = C - (G' \mod C) = 1$ $C'' = G' \mod C = 4$ $L''' = 4$ (in case of $j$=0), $L''' = 5$ (in case of $j \geq 1$) [Formula 20]

By applying the Code Block concatenation method shown in FIG. 2 to this example, data after concatenating the Code Blocks, as follows, is as shown in FIGS. 3A and 3B.

$$\underline{f}_i$$ [Formula 21]

In FIGS. 2, 3A, and 3B, first, Code Block concatenation (a process of combining information sequence of multiple Code Blocks into one) is performed in Steps 1 to 3. The basic concept of this Code Block concatenation is to arrange in such a manner that a symbol sequence of each Code Block appears at intervals of Cmux (in this example, Cmux=12). The process thereof is step 3.

Specifically, as seen in step 3 of FIG. 3B, Code Block 0 appears in first 12 symbols; Code Block 1 appears in subsequent 12 symbols; Code Block 2 appears in subsequent 12 symbols; and so forth. In this way, symbol sequence of each Code Block is arranged for each Cmux.

Therefore, if the size of each Code Block is a multiple of Cmux, none of steps 1 and 2 is needed; if the size is not a multiple of Cmux, information having a size smaller than Cmux would a remainder even when step 3 is performed. The process for compensating for the remainder is steps 1 and 2.

Specifically, in the present embodiment, only the remainders obtained by dividing the size of each Code Block by Cmux are arranged in steps 1 and 2; and symbol sequence of each Code Block are arranged in such a manner that appears at intervals of Cmux in step 3.

The sequence obtained through the Code Block concatenation method shown in FIGS. 3A and 3B is characterized in that the Code Block changes at intervals (of the number of sequence of the 3GPP channel interleaver) due to step 3. Accordingly, when inputting this sequence to the 3GPP LTE channel interleaver and then observing the output of the interleaver in a time axis, the distribution is such that a Code Block to which the modulation symbol belongs changes for each modulation symbol in all locations.

As shown in FIGS. 3A and 3B, these changes form a repeated pattern of Code Blocks 0, 1, 2, . . . , C−1, 0, 1, 2, . . . , C−1, and so forth. Accordingly, by using the process according to the present embodiment, any burst errors that occur during transmission are channel-deinterleaved by the receiving side and then distributed as random errors to all Code Blocks.

Thus, it is possible to solve the problem "even after deinterleaved by the receiving side, the errors intensively occur in the particular Code Blocks, which then suffer significant degradation of transmission characteristics" described in Problems to be solved by Invention above.

That is, the present embodiment can achieve "when burst errors occur, the errors are uniformly distributed to all Code Blocks in the Transport Block, thereby no occurring unevenness in error resilience between the Code Blocks (no difference in error resilience between the Code Blocks)" described in Problems to be Solved by Invention above.

While the invention of the present application has been described with reference to the embodiment, the invention is not limited thereto. Various changes understandable for those skilled in the art can be made to the configuration or details of the invention of the present application without departing from the scope of the invention.

The present application claims priority based on Japanese Unexamined Patent Application No. 2011-143663, filed on Jun. 29, 2011, the disclosure of which is incorporated herein in its entirety.

REFERENCE SIGNS LIST

11 TRANSPORT BLOCK CRC ATTACHMENT
12 CODE BLOCK SEGMENTATION
13 CODE BLOCK CRC ATTACHMENT
14 TURBO CODING & RATE MATCHING
15 CODE BLOCK CONCATENATION
16 DATA & CONTROL MULTIPLEXING
17 CHANNEL INTERLEAVER

The invention claimed is:

1. A radio transmitting/receiving device that uses a channel interleaver with turbo codes serving as error-correcting codes to convert burst errors into random errors, wherein
the radio transmitting/receiving device, when dividing a Transport Block into a plurality of Code Blocks, performs channel coding so that burst errors that occur during transmission are distributed to all the Code Blocks, and
performs a process of combining, for each bit of a modulation multi-level number, a bit sequence after performing turbo coding and rate matching to the Code Blocks,
wherein the process of combining for each bit of the modulation multi-level number includes arranging in such a manner that a symbol sequence of each of the Code Blocks appears at intervals of a number of columns in a channel interleaver after a symbol sequence of remainders obtained by dividing a size of each Code Block by the number of columns in the channel interleaver are arranged.

2. A communication system comprising the radio transmitting/receiving device according to claim 1.

3. A channel coding processing method used in a radio transmitting/receiving device that uses a channel interleaver with turbo codes serving as error-correcting codes to convert burst errors into random errors, the method comprising:
performing, when dividing a Transport Block into a plurality of Code Blocks, channel coding so that burst errors that occur during transmission are distributed to all the Code Blocks, and
performing a process of combining, for each bit of a modulation multi-level number, a bit sequence after performing turbo coding and rate matching to the Code Blocks,
wherein the process of combining for each bit of the modulation multi-level number includes arranging in such a manner that a symbol sequence of each of the Code Blocks appears at intervals of a number of columns in the channel interleaver after a symbol sequence of remainders obtained by dividing a size of each Code Block by the number of columns in the channel interleaver are arranged.

* * * * *